United States Patent
Gerber

(10) Patent No.: US 6,239,248 B1
(45) Date of Patent: May 29, 2001

(54) PHENOL-NOVOLACS WITH IMPROVED OPTICAL PROPERTIES

(75) Inventor: Arthur H. Gerber, Louisville, KY (US)

(73) Assignee: Borden Chemical, Inc., Columbus, OH (US)

(*) Notice: Subject to any disclaimer, the term of this patent is extended or adjusted under 35 U.S.C. 154(b) by 0 days.

(21) Appl. No.: 09/298,153

(22) Filed: Apr. 23, 1999

Related U.S. Application Data

(63) Continuation-in-part of application No. 09/158,584, filed on Sep. 22, 1998, now Pat. No. 6,001,950.

(51) Int. Cl.$^7$ ............................... C08G 8/04; C08G 14/04

(52) U.S. Cl. ...................... 528/129; 528/245; 528/501; 528/502 R; 528/503; 525/134; 525/135; 525/154; 525/155; 428/311.11; 442/65; 442/153; 442/164

(58) Field of Search ...................... 528/129, 245, 528/501, 502 R, 503; 525/134, 135, 154, 155; 428/311.11; 442/65, 153, 164

(56) References Cited

U.S. PATENT DOCUMENTS

| | | | |
|---|---|---|---|
| 4,501,787 | 2/1985 | Marchetti | 428/236 |
| 4,604,317 | 8/1986 | Berman et al. | 428/285 |

(List continued on next page.)

FOREIGN PATENT DOCUMENTS

| | | |
|---|---|---|
| 2 305 254 | 2/1973 | (DE) . |
| 775591 | 5/1997 | (EP) . |
| 1 544 249 | 2/1979 | (GB) . |

(List continued on next page.)

OTHER PUBLICATIONS

Example 5A as set forth on pages 28 and 29 of the parent application. Copy is attached. The method of Example 5A and the product produced thereby are prior art due to manufacture, use and sale thereof for one year prior to the filing date of this application.

Encylopedia of Polymer Science and Engineering, Second Ed., Vol.6, p. 334, John Wiley a & Sons.

*Primary Examiner*—Helen L. Pezzuto
(74) *Attorney, Agent, or Firm*—George P. Maskas; Kenneth P. Van Wyck

(57) ABSTRACT

The specification discloses a method for the manufacture of a fluorescent polyphenolic product with high UV absorbance, its subsequent epoxidation, polyphenolic products, epoxidized derivatives and compositions thereof as well as laminates containing fluorescent polyphenolic products and derivatives thereof. The polyphenolic products are prepared by heating glyoxal at a temperature of about 80° C. to about 100° C. with a molar excess of a phenol in the presence of an acidic catalyst which is eliminated from the reaction mixture at a temperature below about 170° C. The total mole ratio of glyoxal to phenol charged to the reaction mixture is about 0.15 to 0.22 moles of glyoxal for each mole of phenol. The glyoxal is added continuously or by stepwise additions to the phenol so as to keep the aldehyde units in the reaction mixture to less than about 70% of the aldehyde units in the total quantity of glyoxal to be charged for making the polyphenol. Water is distilled stepwise or continuously from the reaction mixture. The catalyst is removed from the reaction mixture by further distilling the reaction mixture, generally at higher temperatures. After removal of the catalyst, unreacted phenol is removed by distillation and the reaction mixture is heated at a temperature of about 175° C. to 200° C. for about 0.25 hours to about 3 hours to produce a polyphenolic reaction product having high fluorescence, high UV absorbance and high solubility in organic solvents. The polyphenolic reaction product can be epoxidized by conventional means and such epoxy products used in the manufacture of laminates, coatings and adhesives.

25 Claims, 1 Drawing Sheet

U.S. PATENT DOCUMENTS

| | | | | |
|---|---|---|---|---|
| 4,895,755 | * | 1/1990 | Berman et al. | 428/290 |
| 5,012,016 | | 4/1991 | Li | 568/720 |
| 5,089,589 | | 2/1992 | Hesse et al. | 528/129 |
| 5,107,036 | | 4/1992 | Nakajima et al. | 568/727 |
| 5,146,006 | | 9/1992 | Li | 568/720 |
| 5,185,388 | | 2/1993 | Murata et al. | 523/466 |
| 5,191,128 | | 3/1993 | Li | 568/720 |
| 5,252,687 | | 10/1993 | Shiomi et al. | 525/502 |
| 5,407,779 | | 4/1995 | Uetani et al. | 430/192 |
| 5,429,904 | | 7/1995 | Nagase et al. | 430/192 |
| 5,478,871 | | 12/1995 | Takebe et al. | 523/443 |

FOREIGN PATENT DOCUMENTS

| | | |
|---|---|---|
| 80-14414 | 8/1980 | (JP) . |
| 80-140890 | 10/1980 | (JP) . |
| 56-159219 | 12/1981 | (JP) . |
| 82-16855 | 2/1982 | (JP) . |
| 82-25474 | 2/1982 | (JP) . |
| 87-56655 | 3/1987 | (JP) . |

* cited by examiner

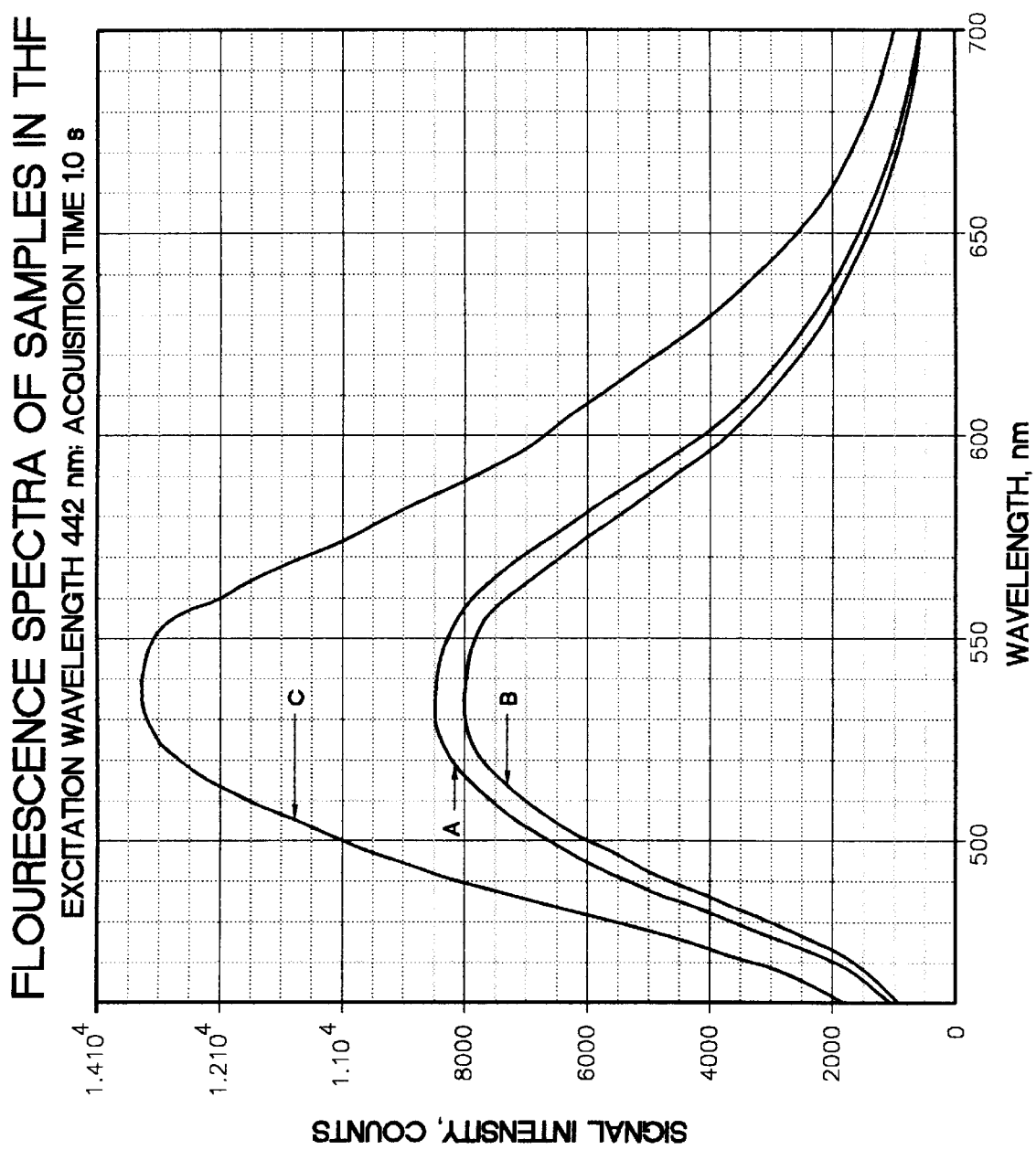

PHENOL-NOVOLACS WITH IMPROVED OPTICAL PROPERTIES

This application is a continuation-in-part of my U.S. patent application Ser. No. 09/158,584 which was filed on Sep. 22, 1998, now U.S. Pat. No. 6,001,950.

This invention relates to phenolic-glyoxal condensates, glycidylated derivatives thereof, compositions containing the condensates and their glycidylated derivatives, laminates of reinforcing fibers in a resin matrix containing epoxidized phenol-glyoxal condensation products or residues of such products, as well as methods for manufacture of the foregoing.

In the methods for making the condensates of this invention, a molar excess of phenol is reacted with glyoxal at a temperature of about 80° C. to 100° C. using an acid catalyst which can be removed from the reaction mixture by distillation at a temperature below that of about 170° C.

The reaction is conducted by making continuous or at least two additions of glyoxal to a phenol wherein the total molar ratio for all additions of glyoxal to phenol is about 0.15 to 0.22. Water in the reaction mixture is removed incrementally by distillation during the reaction.

Less than about 70% of the total glyoxal to be reacted with the phenol is added to the reaction mixture at any one time. Also, less than about 70% of the total aldehyde units to be supplied to the reaction mixture together with any ketone units formed in the reaction are present in the reaction mixture at any one time. Each glyoxal molecule contains two aldehyde units. A way for measuring the aldehyde units together with any ketone units formed is by determining aldehyde equivalents, as later defined. The aldehyde equivalents in the reaction mixture are maintained at less than about 70% of the aldehyde equivalents in the total quantity of glyoxal to be charged to the reaction mixture for making the condensation product. The catalyst is removed from the reaction mixture when at least about 85% of the aldehyde equivalents or aldehyde units in the total quantity of glyoxal to be charged to the reaction mixture for making the condensation product have reacted. Removal of the catalyst also eliminates all or a portion of the water in the reaction mixture. After about 85% of the said aldehyde equivalents have reacted and prior to removal of the catalyst, in those cases where trichloroacetic acid is the catalyst, a sufficient quantity of a basic material is added to the reaction mixture to neutralize HCl to be liberated by the trichloroacetic acid. After removal of the catalyst, the reaction mixture is heated at a temperature of from about 175° C. to 200° C. for about 0.25 hours to 3 hours. Also, after removal of the catalyst, any remaining unreacted phenol as well as water is removed at temperatures above that used for removal of the catalyst.

Broadly, the laminates of this invention are prepared by the use of conventional methods and ingredients but with the use of small quantities of the phenol-glyoxal condensates or reaction products thereof such as, glycidylated, or epoxidized derivatives as part of the resinous matrix in which fibers are embedded.

BACKGROUND AND PRIOR ART

Polyphenols, such as polyphenols prepared from the condensation of glyoxal and a molar excess of phenol in the presence of an acid catalyst, find utility in the same manner as other polyphenols and particularly for preparing epoxidized polyphenols which can be used for coatings and electronic applications as well as adhesives and laminates such as in the production of printed circuit boards.

The polyphenols of this invention will typically contain from about 1% to about 6% of the tetraphenols of ethane. When the phenol is phenol itself, the tetraphenol is tetrakis (p-hydroxyphenyl) ethane which is also referred to as TPE. Although the reaction products of the phenol-glyoxal reaction are mixtures, individual polyphenols such as TPE as well as other components thereof can be crystallized out of solution by conventional techniques. Thus, the level of tetraphenol ethanes, such as TPE in the phenol-glyoxal condensation products, can be greatly reduced to essentially zero by methods well known in the art without sacrifice of desirable optical properties provided by this invention. Illustratively, use of solvents such as alcohol-aromatic hydrocarbon mixtures and water miscible ketone-water mixtures are effective in this regard.

The compositions of this invention are particularly useful when automatic optical inspection (AOI) is used for quality control of laminates. The polyphenols of this invention alone, or in blends with phenolic novolacs, or after epoxidation of the polyphenols, are useful for AOI as are adducts with epoxy resins and adducts of epoxidized phenolic-glyoxal condensates with phenolic novolacs. The AOI is typically performed by measuring: fluorescence at wavelengths in the range of about 450 nm (nanometers) to about 650 nm, particularly at an excitation wavelength of about 442 nm; and/or ultraviolet (UV) light absorbance in the wavelengths of from about 350 to 365 nm.

Applicant has found a set of process conditions together with monomers and certain catalysts for obtaining polyphenols and epoxidized derivatives thereof having UV absorbance and/or fluorescence which is substantially higher than phenol-glyoxal condensates prepared by other methods within the wavelengths generally used for AOI quality control. Photoimageable materials are used in conjunction with these condensates. High UV absorbance is desirable for the manufacture of laminates used in electronic applications such as high density multilayer printed circuit boards.

Advantages of this invention include:

(a) preparation of an essentially metal ion-free polyphenol without recourse to catalyst filtration or neutralization and water washing steps wherein recovery of phenol is simplified and the reactor yield is increased in those cases where the catalyst is not neutralized with a metal ion; (b) preparation of polyphenols as well as the epoxidized derivatives thereof which exhibit improved optical properties, e.g., high fluorescence and/or UV absorbance in the wavelengths used for AOI; and (c) preparation of polyphenols with increased solubility in organic solvents.

The prior art discloses many methods for making polyphenols and epoxidized derivatives thereof. But the prior art does not use the combination of monomers, reaction conditions, or catalyst which applicant uses for obtaining the desirable properties of the products of this invention. Also, the prior art does not disclose phenol-glyoxal condensates having the desirable optical properties of this invention.

As used herein, the following terms have the following meanings:

(a) "phenol-glyoxal condensation product" shall refer to the phenol-glyoxal reaction product produced by the method of this invention wherein such condensate contains less than 5% of unreacted phenol, preferably less than 3% of unreacted phenol and particularly less than 1.5% of unreacted phenol.

(b) "aldehyde equivalents" is a method for measuring aldehyde units and shall refer to aldehyde and any ketone units which may be formed in the reaction mixture or in the glyoxal charged or to be charged when measured by the below described method. Such measurements are generally reported in percent of aldehyde equivalents reacted in comparison with the aldehyde equivalents charged or to be charged to the reaction mixture. Thus, if measurements of aldehyde equivalents in a mixture of the glyoxal and phenol charged show X aldehyde equivalents and measurements after reaction in the reaction mixture later show aldehyde equivalents of ½ of X, then the aldehyde equivalents in the reaction mixture are 50% of that charged. During the reaction, some ketone groups may also be formed which are included in measuring of the aldehyde equivalents and are considered as part of the aldehyde equivalents herein.

The method for determining aldehyde equivalents is by taking 1.0 gram of reaction mixture and diluting it with 50 ml of methanol. The pH is then adjusted to 3.5 with dilute sodium hydroxide. There is then added, to the pH adjusted sample, 25 ml of 10% hydroxylamine hydrochloride with stirring. The sample is stirred for 10 minutes and then the sample is back titrated with 0.25 Normal (N) sodium hydroxide to pH of 3.5. The number of milliliters (mls) (the titre) of the sodium hydroxide solution used to back titrate the sample to a pH of 3.5 is used to calculate the aldehyde equivalents. The mls of sodium hydroxide solution in the titre is adjusted by correcting by titration with sodium hydroxide for the methanol and hydroxylamine hydrochloride reagents used in the test and this is referred to as the mls blank.

The aldehyde equivalents for the sample are then determined by the following formula: (2.9 times 0.25 N times (mls sodium hydroxide titre minus the mls of the sodium hydroxide in titrating the blank). The value obtained by this formula is then compared to the aldehyde equivalents obtained by the above method and formula based on one gram of an unheated, catalyst free mixture of phenol and glyoxal in the weight ratio of glyoxal to phenol used until that time or the time in question in order to determine the percent aldehyde equivalents reacted.

Unless otherwise indicated, the fluorescence measurements herein are as the maximum counts per second for a 0.05% solution of the material in question dissolved in tetrahydrofuran (THF) at an excitation wave length of 442 nm for an acquisition time of one second with a CM 1000 instrument when measured within the range of about 450 to 650 nm. CM 1000 refers to Cure Monitor 1000 which is an instrument made by Spectra Group Ltd., Inc. of Maumee, Ohio. Acquisition time is the exposure time at the designated wavelength. A count is a basic unit used by a large number of light measuring devices for data output and refers to a process of digitization of accumulated signal. In the case of a CCD detector that is used by Spectra Group Limited, Inc. of Maumee, Ohio and which was used for the data set forth herein, light produces an electrical charge on the detector that is subsequently read out by a digitizer. The digitizer is set to record one count for approximately every 10 units of charge (electrons) it reads.

The fluorescence measurements are on a comparative basis among the various materials such as in each of the tables set forth herein and not as absolute numbers. Thus, the fluorescence values of polyphenols within any one of the tables set forth later herein are relative to other polyphenols within the same table, but comparisons cannot be made with the same or other polyphenols in other tables.

The UV absorbance values are obtained from samples prepared by dissolving the material in question in THF (tetrahydrofuran) at a concentration of 10 mg (milligrams) per 100 ml (milliliters) and the absorbance measurement made at 350 nm or 365 nm.

SUMMARY OF THE INVENTION

In one aspect, this invention is directed to a method for preparing a polyphenolic product by incrementally contacting and reacting glyoxal with a molar excess of phenol in the presence of an acidic catalyst which can be removed from the reaction mixture by distillation at temperatures below about 170° C. A reaction temperature of about 80° C. to about 100° C. is used for the reaction. Water is removed incrementally from the reaction mixture by distillation while the aldehyde equivalents in the reaction mixture are maintained at less than about 70 percent based on the aldehyde equivalents in the total amount of aldehyde to be charged to the reaction mixture in making the polyphenol. The mole ratio of glyoxal charged to the reaction mixture is from about 0.15 to about 0.22 moles of glyoxal for each mole of phenol. The reaction is terminated by distillation to remove the catalyst when at least about 85% of the aldehyde equivalents in the total quantity of glyoxal to be charged for making the condensation product have reacted. When trichloroacetic acid is the catalyst, a basic material is added to the reaction mixture prior to removal of the catalyst to neutralize any hydrochloric acid which may be released during removal of catalyst. Removal of the catalyst also removes some or all of the water in the reaction mixture. After elimination of the catalyst: (a) free or unreacted phenol is distilled out of the reaction mixture so that the product is free of catalyst and contains less than about 5% of phenol; and (b) the reaction mixture is heated at a temperature of from about above 175° C. to about 200° C. for 0.25 to 3 hours.

In another aspect, this invention is directed to a method of preparing a polyphenolic product which comprises: charging and reacting phenol, and about 0.06 to 0.11 moles of a 40% solution of glyoxal in water in the presence of about 2 to 5% of oxalic acid, the moles of glyoxal based on the moles of phenol charged; distilling the reaction mixture a first time to remove about 8% to 12% of distillate after about 1 to 5 hours of reaction time; charging another 0.06 to 0.11 moles of glyoxal based on phenol charged so that the total quantity of glyoxal charged is from about 0.15 to 0.22 moles for each mole of phenol; continuing the reaction for about another 1 to 5 hours from the time the first distillation was commenced, and distilling the reaction mixture a second time to recover about 6% to 12% of distillate; and continuing the reaction until at least about 85% of the aldehyde equivalents in the total quantity of glyoxal to be charged for making the condensation product have reacted. The above temperature of phenol reaction with glyoxal, including the distillations, is 80° C. to 100° C. After at least about 85% of the aldehyde equivalents have reacted as discussed above, the temperature is raised and the reaction mixture is distilled at a temperature within the range of about 130° C. to about 170° C. to remove catalyst and water. Unreacted phenol remaining after removal of the catalyst is removed by distillation at temperatures above those used for removal of the catalyst so that the free phenol in the polyphenol condensate is not more than about 5% and the reaction mixture is heated under vacuum at a temperature of about 175° C. to 200° C. for about 0.25 to 3 hours to produce the phenol-glyoxal condensation product.

In a further aspect, this invention is directed to a method for preparing epoxy resins in the form of glycidyl ethers of the above described polyphenols by epoxidizing the polyphenol with a halohydrin in the presence of an alkali metal hydroxide, e.g., sodium hydroxide.

In a still further aspect, this invention is directed to a method for preparing epoxy resins by reacting the phenol-glyoxal condensation product with a preformed epoxy resin to prepare epoxy resin derivatives of the phenol-glyoxal condensation products.

In yet other aspects, this invention is directed to the polyphenols prepared by the methods of this invention and epoxidized products prepared therefrom.

In yet further aspects, this invention is directed to compositions containing the phenol-glyoxal condensation products or epoxidized derivatives thereof and compositions with other phenolic novolacs and/or epoxidized derivatives thereof.

In another aspect, this invention is directed to cured or uncured reaction products of the phenol-glyoxal condensates such as those prepared by glycidylation, epoxidation, or reaction with a phenol-formaldehyde novolac resin or a glycidiylated or epoxidized derivative of a phenol-glyoxal condensate with the novolac resin as well as laminates of reenforcing fibers or fabrics of such fibers in a resin matrix containing the phenol-glyoxal condensates and reaction products thereof.

BRIEF DESCRIPTION OF THE DRAWING

FIG. 1 of the drawing is a graph showing fluorescence spectra of various epoxidized products. Letter "A" indicates the fluorescence spectra curve of EPON 1031 (CAS No.: 7328-97-4) which is a commercial epoxy resin of a polyphenol having less than 1% of free phenol which is commercially used for AOI fluorescence in the same wave lengths which are shown in the graph. EPON 1031 is sold by Shell Chemical Co. Letter "B" indicates the fluorescence spectra curve of the epoxidized product of Example 5A of this application wherein the epoxidized product is produced by the same method as shown in Example 8 herein. Letter "C" indicates the fluorescence spectra of the epoxy product of Example 8.

It can be seen from FIG. 1 of the drawing that the poly glycidyl ether of the phenol-glyoxal condensation product of this invention has unexpectedly greater fluorescence at an excitation wavelength 442 for an acquisition time of one second when measured within the range of 450 to 650 nm in comparison to the commercial product EPON 1031 as well as the poly glycidyl ether of the product of Example 5A.

DETAILED DESCRIPTION OF THE INVENTION

The Phenolic Monomer

The phenolic monomer, also referred to simply as a phenol, is a phenol which can be unsubstituted or substituted, e.g., with alkyl, phenyl or alkoxy groups. Typical phenolic monomers are the mononuclear or binuclear, monohydroxyphenols which have at least one ortho or para position available for bonding.

The phenolic monomer will typically contain up to about 12 carbon atoms and preferably up to about 8 carbon atoms. Such compounds include: phenol itself; alpha-naphthol; phenylphenol; cresols, e.g., 2-methylphenol and 3-methylphenol; various xylenols, e.g., 2,5-dimethylphenol and 3,5-dimethylphenol; and other alkyl phenols; and alkoxyphenols such as 2-methoxy- or 3-methoxyphenol. Mixtures of phenolic compounds can be used. A preferred phenolic compound is unsubstituted phenol, i.e., phenol itself.

Preferred phenolic monomers can be represented by the following formula:

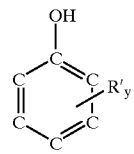

wherein R' is selected from phenyl, alkyl of 1 to 4 carbon atoms and alkoxy of 1 to 4 carbon atoms and $_y$ is an integer of 0 to 3.

When R' is alkyl or alkoxy, $_y$ is 1 to 3, and when R' is phenyl, $_y$ is 1. Mixtures of the phenolic monomers can also be used.

The Glyoxal Reactant

The glyoxal reactant can be in various forms such as relatively pure monomeric glyoxal, polymerized glyoxal or glyoxal dissolved in water and mixtures thereof. Illustratively, glyoxal is normally used as a 40% solution in water.

The Acid Catalyst

The acid catalyst is one which can be removed from the reaction mixture by distilling the reaction mixture at a temperature above about 80° C. but below about 170° C. and preferably below about 160° C. Illustratively, the catalyst can be oxalic acid or a trihaloacetic acid or mixtures thereof.

In the case of oxalic acid as catalyst, the temperature of the reaction mixture is raised above about 130° C. such as up to about 170° C. together with distillation and preferably the temperature is raised to about 140° C. to about 160° C. so that the oxalic acid catalyst is decomposed to volatile components.

Oxalic acid can be used in its various forms such as the pure compound, the dihydrate, or mixtures thereof, all of which are referred to as oxalic acid herein.

Illustrative of the trihaloacetic acid catalyst there can be mentioned: trichloroacetic acid and trifluoroacetic acid. Trifluoroacetic acid may need to be replenished during the reaction since a portion thereof distills together with the water. Trifluoroacetic acid forms an azeotropic mixture in water. Therefore, when it is desired to remove the trifluoroacetic acid catalyst, it is preferred that a series of distillations be made with the addition of water after each distillation so as to remove substantially all of the acid.

When trichloroacetic acid is used as the catalyst, the temperature is raised up to about 170° C. to remove the catalyst after any hydrochloric acid to be formed from the trichloroacetic acid is neutralized.

The quantity of the catalyst can vary from about 1% to about 6% based on the weight of the phenol charged to the reaction mixture. The quantity of oxalic acid is from about 1% to 6%, preferably about 1.5% to about 5% and particularly about 2.5% to about 4% based on the weight of phenol charged to the reaction mixture. When a trihaloacetic acid is used as catalyst, the quantity of catalyst is preferably from about 1% to about 4% by weight based on the phenol charged to the reaction mixture and particularly about 1% to about 3%. Mixtures of the acid catalysts can also be used.

The Reaction Conditions

The polyphenols (condensation products) of this invention may be prepared by continuous or step-wise contact of the glyoxal with a molar excess of the phenol in the presence of the acid catalyst. Illustratively, for stepwise reaction, a phenol and the acid catalyst are charged to a reactor and then an initial increment of the glyoxal is charged to the reactor while the reaction mixture is maintained at a temperature of about 80° C. to about 100° C. The glyoxal reacts with the phenol and then additional glyoxal is charged to the reaction mixture.

The molar ratio of glyoxal to phenol in the manufacture of the phenol-glyoxal condensation products is from about 0.15 to 0.22 moles of glyoxal for each mole of phenol charged and preferably about 0.16 to 0.20 moles of glyoxal for each mole of phenol charged. When a total of two increments of glyoxal are made to the reaction mixture, it is preferred that each increment be from abut 0.06 to 0.11 moles of glyoxal based on the total moles of phenol charged and particularly about 2 equal molar quantities of the glyoxal. Total mole ratios of less than about 0.15 moles of glyoxal for each mole of phenol charged give more of the tetraphenols, such as TPE which is essentially devoid of optical properties in the ranges given above for AOI quality control. Ratios of greater than about 0.22 moles of glyoxal for each mole of phenol lead to longer reaction times and are likely to give product with higher viscosity.

The aldehyde equivalents or aldehyde units in the reaction mixture are maintained at less than about 70%, and preferably less than about 60% of the total aldehyde equivalents or aldehyde units which will be charged to the reaction mixture for making the phenol-glyoxal condensate. Thus, not more than about 70% of the aldehyde equivalents to be used in the reaction are present in the reaction mixture at any one time.

The catalyst is removed from the reaction mixture after at least about 85% of the aldehyde equivalents of the total aldehyde equivalents to be charged to the reactor have reacted, and preferably when from about 90% to 95% of such aldehyde equivalents have reacted. Then the temperature is generally raised to remove the catalyst. However, when trichloroacetic acid is the catalyst, a basic material is added to the reaction mixture in an amount sufficient to neutralize any hydrochloric acid to be formed as a decomposition product of such acid before distillation is effected to remove the catalyst.

When the basic material used to neutralize hydrochloric acid is an alkali metal oxide or hydroxide or an alkaline earth metal oxide or hydroxide, e.g., sodium hydroxide or calcium hydroxide about 80% molar equivalents of such base are added based on the molar equivalents of the trichloroacetic acid used as catalyst. When an amine is used as the basic material, about 10% to 20% of the amine molar equivalents are added to the reaction mixture for neutralizing HCl based on the molar equivalents of trichloroacetic acid used as catalyst. It is preferred that the basic material be an amine so that metal ions such as that of alkali metal or alkaline earth metals not be included in the product. The presence of metal ions is deleterious for use of the product in the more demanding electronic applications. Illustrative of amines for neutralizing the hydrochloric acid there can be mentioned amines having a pKa value of about 5 to about 11 such as pyridine, picoline, benzyldimetylamine, triethylamine, and hydroxyethyidiethylamine.

The total time for the condensation reaction of aldehyde with the phenol will typically vary from about 5 to about 15 hours and preferably about 8 to 12 hours.

The temperature of the condensation reaction of the phenol and glyoxal in the presence of the catalyst, including distillations, will be in the range of from about 80° C. to about 100° C. and preferably from about 85° C. to 95° C. until at least about 85% or more of the aldehyde equivalents in the total quantity of glyoxal to be charged for making the condensation product have reacted.

Water is removed continuously or intermittently by distillation, such as after the reaction of glyoxal with phenol following individual additions of the glyoxal, since accumulation of water in the reaction mixture slows the reaction. Water is formed by the condensation reaction of glyoxal with phenol and additionally water is generally present in the glyoxal charge, e.g., glyoxal is generally used as a 40% solution in water.

The water content in the reaction mixture is preferably kept to below about 8% by weight based on the phenol charged to the reaction mixture and preferably below about 6% based on the weight of phenol charged to the reaction mixture. Illustratively, two or more, e.g. 2 to 4, additions of the glyoxal are made to the reaction mixture with distillation of water after reaction of glyoxal with the excess phenol. Preferably, an initial glyoxal charge is made with the subsequent reaction followed by distillation of water and then a second glyoxal charge is made followed by reaction of the monomers prior to reacting at least about 85% of the total aldehyde equivalents to be used for making the condensation product.

Instead of monitoring the progress of the reaction by measuring aldehyde equivalents, the time of reaction can be used for conducting the reaction when the reactants and catalysts are the same and the operating conditions are within the same ranges, e.g., mole ratios, reaction temperatures, the catalyst and the quantity thereof; times for distillation of water and the amount of distillate. Illustratively, the following steps and time periods can be used when: total molar ratio of glyoxal to phenol is from about 0.15 to 0.22; a 40% solution of glyoxal is reacted with phenol itself at a temperature of 80° C. to 100° C.; an initial glyoxal charge is made with subsequent reaction of the glyoxal with phenol and in time by distillation, followed by another glyoxal addition followed by continued reaction and then distillation which is followed by continued reaction before depletion of the aldehyde equivalents to 15% or less of that charged. From about 0.06 to 0.11 moles of the glyoxal, based on the amount of phenol charged, are added with each charge of the glyoxal. Thus, after addition of the initial quantity of glyoxal, the aldehyde is reacted with the phenol for about 1 to 5 hours, preferably 1.5 to 3 hours and then there is distilled from about 8% to 12% of a first distillate from the reaction mixture based on the weight of phenol charged.

After the first distillation, which is also conducted within the temperature range of about 80 to 100° C. another 0.06 to 0.11 moles of glyoxal based on the moles of phenol charged, are slowly added to the reaction mixture. Preferably, there is charged about equal quantities of glyoxal during each addition. Heating of the reaction mixture is continued for another 1 to 6, preferably 1.5 to 5 hours from the time the first distillation commenced and then a second distillation is started to remove about another 4% to 12% of water based on the phenol charged. After the second distillation, the reaction is permitted to continue for another 0.5 to 6, preferably 1 to 4 hours from the time the second distillation commenced before the temperature is raised for distillation together with removal of the catalyst.

The temperature of 80° C. to 100° C. is used until it is time to raise the temperature and remove the catalyst or unreacted phenol. Such distillation, prior to increasing the temperature for removal of catalyst, is conducted under vacuum so as to assist in the control of the temperature. The vacuum can vary from about 15 to 25 inches or more of mercury.

The temperature for removal of the catalyst by distillation is less than about 170° C., preferably less than about 160° C. When oxalic acid is the catalyst, the temperature is raised above 135° C. to about 170° C., particularly about 155° C. to about 160° C.

All or some of the water is removed at the time the catalyst is removed. In the case where oxalic acid is the catalyst, all or substantially all of the water is removed when the catalyst is removed from the reaction mixture. Any water remaining in the reaction mixture after elimination of the catalyst is finally removed by the distillation in removal of the phenol.

After removal of the water and all of the catalyst, unreacted (free) phenol is removed from the reaction mixture so as to bring the free phenol content of the reaction mixture to less than about 5%, preferably to less than about 2% and particularly less than about 1.5% by weight of the reaction mixture.

Removal of the unreacted phenol is attained by conventional means such as in the removal of unreacted phenol in novolac resins, e.g., flash distillation by heating the reaction mixture at an elevated temperature under vacuum. Thus, the temperature can be up to about 190° C. or 200° C. under about 25 to 30 inches of mercury. Steam sparging under vacuum at such temperatures can also be used to remove phenol in the product.

Concurrently with removal of phenol or as a separate step following removal of the catalyst, the reaction mixture is heated at a temperature of from about 175° C. to about 200° C. and preferably from about 180° C. to about 195° C. Such heating is conducted for a period of about 0.25 to 3 hours and preferably for about 0.5 to 2 hours. All or a portion of such heating can be conducted at the time the phenol is removed under vacuum. Optionally, the phenol-glyoxal condensation product with 5% or less of unreacted phenol can be placed in an inert atmosphere and heated to conduct a portion or all of the heating in the range of about 175° C. to 200° C. for about 0.5 to 3 hours. Illustrative of an inert atmosphere there can be mentioned nitrogen or argon. After such heating step at about 175° C. to 200° C. and reduction of phenol in the reaction mixture to less than 5%, the reaction mixture is also referred to as the phenol-glyoxal condensation product.

The phenol-glyoxal condensation product is eventually cooled and generally comminuted, e.g., flaked.

The Phenol-Glyoxal Condensation Products

Properties of the phenol-glyoxal condensation products are as follows:

| Property | Broad Range | Preferred Range |
| --- | --- | --- |
| Mw/Mn | 400–600/300–390 | 440–540/320–370 |
| Viscosity, cps at 175° C. | 300–2500 | 450–1500 |
| Free Phenol (%) | 0–5 | 0.03–1.5 |
| Tetraphenol ethane such as TPE (%) | 0–6 | 1–4 |
| UV absorbance at 350 nm | at least 0.400 | at least 0.450 particularly >0.5 |
| UV absorbance at 365 nm | at least 0.260 | at least 0.275 particularly >0.30 |

Fluorescence: The fluorescence of the phenol glyoxal condensates is about 70% higher at fluorescence maximum (about 532 nm) than Acridine Orange Base (Aldrich Chemical) using an excitation wavelength of 442 nm, acquisition time of 0.5 seconds as measured in a CM 1000 instrument (Spectra Group Ltd, Inc. of Maumee, Ohio). Acridine Orange Base was used at a concentration of 0.2 mg per liter in methanol and the phenol-glyoxal condensate at a concentration of 0.05 weight percent in tetrahydrofuran. The Acridine Orange base of Aldrich Chemical is described on page 33 of the Aldrich Chemical catalogue which is dated 2000–2001.

The phenol-glyoxal condensation products contain a variety of compounds, including polyphenols such as di-, tri-, and tetraphenols. Illustratively, such tetraphenols can be represented by the formula:

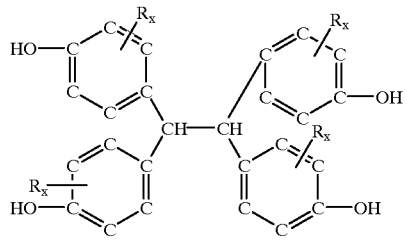

wherein $x$ is an integer of 0 to 3. When R is alkyl and or alkoxy $x$ is 1–3 and the alkyl and alkoxy groups have 1 to 4 carbon atoms. When the reactants are phenol itself and glyoxal, the above polyphenol is tetrakis(4-hydroxyphenyl) ethane (TPE) which is also referred to as 1,1,2,2-tetrakis(4-hydroxyphenyl)ethane. Epoxidation of the tetrakis(4-hydroxyphenyl)ethane gives the tetraglycidyl ether of tetrakis(4-hydroxyphenyl)ethane.

If 10 grams of a phenol-glyoxal condensate are reacted with 40 grams of an epoxide, the amount phenyl-glyoxal condensate residue of the composition would be 10 grams. Also, if 20 grams of a phenol-glyoxal condensate is glycidylated and the glycidylated product is subsequently reacted with a phenol-formaldehyde novolac, the amount phenol-glyoxal residue would still be 20 grams.

The epoxy resin used in the laminate compositions of this invention will have a weight per epoxide (WPE) value of from about 190 to 10,000 and preferably from about 190 to 500.

The pressure used in making the laminates can vary from the contact pressure of applying a laminated lining to a tank wall to the high pressure, e.g., 1,000 psi or more, used in the manufacture of electrical insulation sheets. The temperature used in making the laminates can vary over a wide range such as that of about room temperature to over 210° C.

The use of a solvent in the laminate compositions is optional.

Preparation of Polyepoxides

Epoxidized products of the phenol-glyoxal condensates can be prepared by at least two different conventional routes. One route is by reaction of the phenol-glyoxal condensate with a halohydrin in the presence of an alkali metal hydroxide to form glycidyl ethers of the polyphenol. Such epoxidized products will typically have epoxy equivalents of about 190 to 230 and preferably about 205 to 225. The other route is by reacting a molar excess of a preformed polyfunctional epoxy with the phenol-glyoxal condensate. Such epoxidized products by the other route will typically have epoxy equivalents of about 140 to 250 and preferably about 160 to 230.

In the first route, the polyepoxide is prepared by contacting the phenol-glyoxal condensation product with an excess of epichlorohydrin in the presence of an alkali metal hydroxide such as sodium hydroxide or potassium hydroxide at a temperature within the range of about 50° C. to about 80° C. Optional catalysts, such as quaternary ammonium salts, may be employed. The reaction can be carried out in the presence of an inert solvent, including alcohols such as ethanol, isopropanol, methyl isobutyl ketone (MIBK), toluene, ethers, and mixtures thereof.

Another method for preparing the polyepoxide by the first route is set forth in U.S. Pat. No. 4,518,762 of May 21, 1985 to Ciba Geigy Corp. which is incorporated herein by reference in its entirety. Briefly, in this process, the polyphenol, preferably the phenol-glyoxal purified product, is reacted at a temperature of 40° to 100° C., in the absence of any catalyst specific for the formation of the chlorohydrin ether intermediate, in the presence of 2 to 25% by weight, based on the reaction mixture, of a lower alkanol or lower alkoxyalkanol cosolvent, with excess epichlorohydrin, based on the phenolic hydroxy value, in the presence of 0.5 to 8% by weight of water, based on the reaction mixture, and with 0.9 to 1.15 equivalents of solid alkali metal hydroxide per phenolic hydroxyl group to give the epoxy derivative of the polyphenol and wherein there is 0.5% to 8 % by weight of water in the reaction mixture throughout the reaction period, using a solid alkali metal hydroxide in the form of beads of about 1 mm diameter, which hydroxide is charged to the reaction mixture portionwise or continuously during a gradually escalating addition program, and then isolating the epoxy novolac resin.

In the second route for preparation of the epoxy resins containing the phenol-glyoxal condensation products of this invention, one part by weight of such condensation product is reacted with 4 to 8 parts of a polyepoxide at about 100° C. to about 150° C. using a catalyst, e.g., potassium hydroxide, benzyldimethylamine, benzyltrimethylammonium hydroxide, 2-methyl imidazole, and 2,4,6-tris (dimethylaminomethyl)phenol. Typical catalyst levels are about 0.1% to about 0.6% based on the reaction mass. Typical polyepoxides for reaction with the phenol-glyoxal condensation product are those of diglycidyl ether resins, e.g., the diglycidyl ether resins of: bisphenol A; bisphenol F; resorcinol; neopentyl glycol; cyclohexane dimethanol; and mixtures thereof.

The phenol-glyoxal condensation products of this invention can also be partially epoxidized without sacrifice in the desirable optical properties by reduction of the quantity of alkali used in the reaction with epichlorohydrin. Illustratively, reduction of caustic to about 40% to 70% of that in the methods of the above described first route affords partially epoxidized derivatives.

Unless trichloroacetic acid is used as catalyst with metal ion oxides or hydroxides for neutralization of the hydrochloric acid, the phenol-glyoxal condensation products of this invention will typically have a percent by weight concentration of metal ions of less than about: 0.005% for sodium: 0.003% for calcium; 0.003% for iron; and 0.002 % for potassium.

The phenol-glyoxal condensates can be used alone to cure epoxy resins but preferably they are used in combination with other epoxy resin curing agents.

The laminates of this invention are conventional laminates containing a reinforcing agent such as glass cloth, and a resinous matrix comprising an epoxy resin and a curing agent for the epoxy agent such as a phenol-formaldehyde resin, except that the resinous matrix will also contain from about 1 to 35 parts by weight, preferably about 1 to 15 parts and particularly about 2 to 10 parts by weight, based on the weight of of the resinous matrix, of a phenol-glyoxal condensate, residue or mixture thereof. The epoxy resin, curing agent, phenol-glyoxal condensate or residue thereof and optionally a solvent system for the epoxy and curing agent, will generally comprise at least 75% of the resinous matrix or mixture.

The resinous matrix of the laminates of this invention containing a solvent will generally contain, by weight, from about 40 to 80 and preferably 50 to 70 parts of an epoxy resin; about 1 to 15 parts and preferably about 2 to 10 parts of a phenol-glyoxal condensate, residue or mixture thereof about 10 to 35 and preferably 15 to 30 parts of a solvent and about 7 to 35 parts of a conventional epoxy curing agent.

The preferred polyepoxide products of this invention when used in electronic applications such as laminates for the production of printed circuit boards will typically comprise the following composition based on 100 parts of an epoxy resin, e.g., an epoxy resin such as the diglycidyl ether of bisphenol A:

(a) about 18–25 parts of a curing agent such as a phenol-formaldehyde novolac;

(b) about 3–10 parts of a member selected from the group consisting of a glycidylated phenol-glyoxal condensation product, a reaction product of an epoxy resin and a phenol-glyoxal condensation product, a phenol-glyoxal condensation product and mixtures thereof; and (c) optionally, an epoxy curing accelerator.

Epoxy resins for laminating and coating formulations are generally solvent based. Coating formulations may include fillers whereas laminating formulations generally impregnate multiple layers of a fiber matrix such a glass cloth with a phenolic compatible finish.

The laminates of this invention can be made flame retardant by conventional techniques such as the use of a halogenated epoxy resin as the main resin matrix ingredient or a brominated or chlorinated flame resistant additive such as chlorinated bisphenol-A, tetrachlorinatied bisphenol-A or tris (2,3-dibromopropyl)phosphate and antimony oxide.

Conventional laminating techniques can be used in making the laminates of his invention such as the wet or dry-lay-up techniques.

The laminates of this invention will generally contain about 40% to 80% by weight of resinous matrix material and about 20% to 60% by weight of reinforcing material such as glass cloth.

Epoxy resins useful in this invention are generally those derived from bisphenol-A and brominated bisphenol A with weight per epoxy (WPE) values of about 190 to about 2,000. Other epoxy resins which may be used apart from the bisphenol A resins include: epoxy phenol novolacs; epoxy cresol novolacs; aromatic glycidyl amine resins such as tri glycidyl-p-amino phenol; N,N,N',N'-tetraglycidyl-4,4'-diaminodiphenyl methane. Epoxy phenol novolacs include epoxy resins derived from phenol-glyoxal condensates by reaction with epichlorohydrin, in the presence of alkali such as Epon 1031 of Shell Chemical; reaction products of an epoxy resin and a phenol-glyoxal condensation product. The conventional epoxy resin making up the 100 parts of the composition is preferably a flame retardant epoxy resin such as a halogenated epoxy resin, e.g., chlorinated or brominated epoxy resin. Illustrative of such brominated epoxy resins there can be mentioned the brominated product of the diglycidyl ether of bisphenol A, e.g., EPON 1124 (CAS No.: 26265-08-07) of Shell Chemical Co. This brominated epoxy resin can be used in flame retardant compositions with epoxy resins such as those of glycidyl ethers of a phenolic novolac, glycidyl ethers of an o-cresol/formaldehyde novolac, diglycidyl ethers of bisphenol A, diglycidyl ethers of bisphenol F, diglycidyl ethers of resorcinol, diglycidyl ethers of neopentyl glycol or diglycidyl ethers of cyclohexanedimethanol and mixtures thereof.

Epoxy curing accelerators can be used in a quantity sufficient to accelerate the cure of the epoxy resin. Generally, such quantity is from about 0.05 to 0.5 parts based on 100 parts of the epoxy resin and particularly about 0.1 to 0.2 parts. Such accelerators include 2-methylimidazole, 2-ethyl- 4-methylimidazole, amines such as 2,4,6-tris (dimethylaminomethyl)phenol and benzyldimethylamine, and organophosphorus compounds such as tributylphosphine and triphenylphosphine.

Reactive diluents may also be present to lower viscosity and improve handling characteristics. Examples of reactive diluents include neopentylglycol diglycidyl ether; butanediol diglycidyl ether; resorcinol diglycidyl ether; and cyclohexane dimethanol diglycidyl ether.

A variety of curing agents well known in the art can be used for the epoxy resin. They include but are not limited to aromatic amines, polyamidoamines; polyamides; dicyandiamide; phenol-formaldehyde novolacs; and melamine-formaldehyde resin.

When phenol novolacs are used as curing agents a catalyst (accelerator) is generally employed and may be selected from tertiary organic amides such as 2-alkylimidazoles; N,N-dimethylbenzylamine; and phosphines such as triphenylphosphine and mixtures thereof.

The phenol novolac curing agents are condensation products of phenol with formaldehyde wherein the phenol can be selected from phenol itself, cresols, xylenols, resorcinol, bisphenol-A, paraphenyl phenol, naphthol, and mixtures thereof. Substituents for the monomers include hydroxy, alkyl of 1 to 4 carbon atoms, alkoxy of 1 to 4 carbon atoms as well as phenyl. Novolacs and dicyanodiamides are preferred curing agents. Particularly preferred curing agents are the phenol-formaldehyde novolacs and ortho-cresol-formaldehyde novolacs having a molecular weight of 1,000 to 5,000.

A wide variety of solvents may be used, including haolgenated solvents, ketones, alcohols, glycol ethers, glycol acetates, N,N-dimethylformamide. The later is particularly useful when dicyandiamide is used as curing agent. Ketones include acetone, methyl ethyl ketone, diethyl ketone, and methyl isobutyl ketone.

Reinforcing fibers or fabrics of reinforcing fibers include glass fibers and mats; carbon and graphite fibers, cellulosic paper, fibrous polyamide sheets, fibrous quartz sheets, woven fibrous glass cloth, unwoven fibrous glass mat, and the like.

Fillers such as quartz powdered, mica, talc, calcium carbonate and the like may also be added to the resinous matrix.

The laminate can be prepared at room temperature or by heating under pressure a layer comprising at least one sheet of prepreg comprising an epoxy resin as impregnant.

The weight average molecular weight (Mw) and number average molecular weight(Mn) herein are measured using gel permeation chromatography and phenolic compounds and polystyrene standards. The sample molecular weight to be measured is prepared as follows: the sample is dissolved in tetrahydrofuran and the solution is run through a gel permeation chromatograph. Any free phenol in the sample is excluded from calculation of molecular weight.

The quantity of TPE in the various reaction mixtures was determined by the following method.

(a) The reagents used were para-ethyl phenol, TPE, and silylation reagent.

(b) Procedure for determining TPE was as follows:
A silylation reagent was prepared as follows: into 25 ml (milliliter) reaction flask, add by syringe: 10 cc (cubic centimeters) of pyridine, 3 cc of trimethylchlorosilane (TMCS), and 10 cc of hexamethyidisilazane (HMDS). This was left to stand for 5 to 10 minutes.

(c) The TPE standard solution is prepared as follows:

Weigh into vial (appropriate for silylation) approximately 30 mg each TPE and p-ethylphenol. Add 1 cc silylation reagent. Shake until dissolved (approximately 10 minutes). Heat in low temperature oven overnight. Inject 1 microliter into gas chromatograph. Use methyl ethyl ketone as rinses. The column used for this analysis is Dexsil 300 which is supplied by Supelco of Belfonte, Pa.

In order that those skilled in the art may more fully understand the invention presented herein, the following examples are set forth. All parts and percentages in the examples, as well as elsewhere in this application are by weight, unless otherwise specifically stated.

The following examples are illustrative of the invention. Some of the examples are designated as "comparative" to show differences from examples which are part of this invention and not necessarily as comparisons with the prior art.

EXAMPLE 1

PREPARATION OF PHENOL-GLYOXAL CONDENSATION PRODUCT AT 90° C. WITH TWO ADDITIONS OF GLYOXAL AND OXALIC ACID CATALYST

To 1,728 grams (g) (18.36 moles) phenol and 69.1 g oxalic acid dihydrate at 90° C. there was added over 30 minutes 227 g of 40% glyoxal in water (1.57 moles). The temperature was maintained at 90° C. for another 1.5 hours and then there was vacuum distilled 185 g of distillate (10.7% based on the weight of phenol charged) from the reaction mixture at 90° C. over a period of forty minutes. After such heating, approximately 79% of the aldehyde equivalents charged until that time had reacted and the quantity of water in the reaction mixture was about 4%. Another 227 g of 40% glyoxal in water (1.57 moles) was added to the reaction mixture over a 25 minute period while the temperature was maintained at 90° C. for 1.5 hours and then there was vacuum distilled 195 g of distillate (11.3% based on the weight of phenol charged) at 90° C. over a period of thirty minutes. After such heating approximately 70% of the aldehyde equivalents charged until that time had reacted and the water content of the reaction mixture was about 3.5%. The molar ratio of glyoxal to phenol for the total of both glyoxal additions was 0.17. The temperature of 90° C. was maintained for another 1.5 hours. After such heating, 90% of the aldehyde equivalents charged to the reaction mixture until that time had reacted and the water content was about 4.5%. Then the reaction mixture was distilled at atmospheric pressure to 160° C. and held at 160° C. for one hour. The reaction mixture was then vacuum distilled to remove the bulk of unreacted phenol at 155–160° C. Vacuum distillation was continued up to a temperature of 190° C. and held at that temperature for one hour until phenol in the reaction mixture was less than 1%. The resulting phenol-glyoxal condensation product was then comminuted, e.g., flaked. During the reaction the aldehyde equivalents in the reaction mixture were maintained at less than about 70% of the aldehyde equivalents in the total quantity of glyoxal to be charged for making the phenol-glyoxal condensation product. Properties of the phenol-glyoxal condensation product are given in tables which follow.

In the tables which follow, this example is also referred to as EX1.

EXAMPLE 2 (COMPARATIVE)

PREPARATION OF PHENOL-GLYOXAL POLYPHENOL AT 90° C. WITH ONE ADDITION OF GLYOXAL AND OXALIC ACID CATALYST

To 576 g (6.12 moles) phenol and 23 g oxalic acid dihydrate at 85° C. is added over a period of about one hour 151.4 g of 40% glyoxal in water (1.04 moles) during which period the temperature was slowly raised to 90° C. The mole ratio of glyoxal to phenol was 0.17. Immediately thereafter, vacuum is applied to remove 120 g of distillate at 90–95° C. over a period of 60 minutes. A temperature of 90–92° C. was maintained for 2.25 hours after which time about 82% of the aldehyde equivalents charged had reacted. Then vacuum was applied over 15 minutes to remove 13.3 g of distillate. Heating was continued at 90° C. to 91° C. for 1.25 hours. After the 1.25 hour period approximately 88% of aldehyde equivalents charged had reacted. Vacuum was then applied over 6 minutes to remove 6.68 g of distillate. Heating at 90° C. was continued for 5 hours and one hour at 100° C. After such heating for one hour, about 94% of the aldehyde equivalents charged to the reaction mixture had reacted. The reaction mixture was atmospherically distilled to 160° C. The temperature of 160° C. was held for one hour. The reaction mixture was then vacuum distilled to remove the bulk of unreacted phenol at 155–160° C. and the vacuum distillation was continued at 190° C. until phenol in the reaction mixture was less than 1%. During the vacuum distillation the reaction mixture was heated at a temperature of about 175° C. to 192° C. for about 0.25 hours. The reaction mixture is then discharged from the reactor and then comminuted, e.g., flaked. Properties of the polyphenol product of this example are given in tables which follow and this example may be referred to as EX2.

EXAMPLE 3 (COMPARATIVE)

PREPARATION OF PHENOL-GLYOXAL POLYPHENOL AT 102° C. AND REFLUX (103–104° C.) WITH ONE ADDITION OF GLYOXAL AND OXALIC ACID CATALYST

To 576 g (6.12 moles) phenol and 23 g oxalic acid dihydrate at 90° C. there was added over a one hour period 151.4 g of 40% glyoxal in water (1.04 moles) while the temperature was allowed to rise to reflux (103–104° C.). The mole ratio of glyoxal to phenol was 0.17. The reaction mixture was held at reflux for 10 hours. After such reflux approximately 89% of the aldehyde equivalents had reacted. The temperature was then raised to 110° C. and there was removed 55.5 g of distillate over a period of about 22 minutes. The temperature was held at 110° C. for one hour and then the reaction mixture was atmospherically distilled to 160° C. The reaction mixture was then held for one hour at 160° C. The reaction mixture was then vacuum distilled to remove the bulk of unreacted phenol at 155–160° C. and the vacuum distillation was then continued at 176° C. until phenol in the reaction mixture was less than 3%. During the reaction, the aldehyde equivalents in the reaction mixture were maintained at less than about 70% of the aldehyde equivalents in the total quantity of glyoxal to be charged for making the condensation product. The reaction mixture was then discharged from the reactor and comminuted, e.g., flaked. Properties of the polyphenol product of this example are given in tables which follow and this example may be referred to as EX3.

EXAMPLE 4 (COMPARATIVE)

PREPARATION OF PHENOL-GLYOXAL POLYPHENOL AT 102° AND REFLUX (103–104° C.) WITH ONE ADDITION OF GLYOXAL AND HCl CATALYST

To 576 g (6.12 moles) phenol and 6.23 g 18.5% HCl (0.2% HCl on phenol) at 90° C. is added over a one hour period 151.4 g of 40% glyoxal in water (1.04 moles) while the temperature is allowed to rise to reflux (103–104° C.). The molar ratio of glyoxal to phenol was 0.17. After two hours at reflux about 93% of the aldehyde equivalents charged had reacted. The reaction mixture was then vacuum distilled with the temperature rising to 110° C. to remove aqueous HCl distillate of 116.4 g. 100 g of hot water was then added to the reaction mixture and distillation was continued at atmospheric pressure to 150° C. The hydrochloric acid catalyst (HCl) is co-distilled with water from the reaction mixture. Then, by vacuum distillation up to 180°, the unreacted phenol was removed to less than 4% remaining in the reaction mixture. The reaction mixture is then discharged from the reactor and comminuted, e.g., flaked. Properties of the polyphenol product of this example are given in the tables which follow and this example may be referred to as EX4.

EXAMPLE 5 (COMPARATIVE)

PREPARATION OF PHENOL-GLYOXAL POLYPHENOL AT 102° C. AND REFLUX (103–104° C.) WITH ONE ADDITION OF GLYOXAL AND PHENOLSULFONIC ACID CATALYST

To 576 g (6.12 moles) phenol and 5.76 g (grams) (1.5% based on phenol) of 65% phenolsulfonic acid at 90° C. as catalyst there is added over a one hour period 151.4 g of 40% glyoxal in water (1.04 moles). The mole ratio of glyoxal to phenol is 0.17. The temperature of the reaction mixture is permitted to rise to reflux (103–104° C.) where it remained for several hours and the conversion of aldehyde equivalents was up to about 96% of that charged. This is followed by neutralization of the catalyst, cooling to 65° C. and washing with distilled water to remove salt. This is followed by atmospheric distillation to 160° C. and then vacuum distillation at about 176° C. to reduce the quantity of unreacted phenol in the reaction mixture to about 1%. The reaction mixture is eventually comminuted, e.g., flaked.

EXAMPLE 5A (COMPARATIVE)

The procedure of the above Example 5 was followed but the phenolsulfonic acid was replaced by 1.25 g (0.22% based on phenol) of anhydrous methanesufonic acid. Approximately 97% of the aldehyde equivalents charged had reacted prior to neutralization of the catalyst. Essentially, equivalent properties, molecular weights, viscosities, and % of TPE is obtained. Properties of the phenol-glyoxal condensation product are given in tables which follow wherein this example may be referred to as EX5A.

EXAMPLE 6

LARGE SCALE PRODUCTION OF PHENOL-GLYOXAL CONDENSATION PRODUCT IN THE MANNER OF EXAMPLE 1

The phenol-glyoxal condensation product of Example 6 was prepared in substantially the same manner as Example 1 except that it was prepared on large scale equipment which can produce several hundred pounds of product and was vacuum steam sparged at 190° C. to reduce phenol below 0.1%. The percent insolubles were 0.04% for the phenol-glyoxal condensation product of this example whereas other properties are given in tables which follow wherein this example may be referred to as EX6. The test for insolubles was conducted by essentially dissolving 15 g (grams) of condensate in 285 mls (milliliters) of isopropanol, filtering through a No. 42 Whatman filter paper and then drying the paper in an oven at 75° C. to 100° C. for 30 minutes.

EXAMPLE 7

LARGE SCALE PRODUCTION OF PHENOL-GLYOXAL CONDENSATION PRODUCT IN THE MANNER OF EXAMPLE 1

The phenol-glyoxal condensation product of Example 7 was prepared in the same manner as that of Example 6, except that it was prepared at a different time. The percent insolubles in the product were 0.01% whereas other properties are given in tables which follow wherein this example may be referred to as EX7. The test for insolubles was performed in the same manner as in Example 6 above.

EXAMPLE 8

PREPARATION OF POLY GLYCIDYL ETHER RESIN (EPOXY RESIN)

A one liter flask was charged with: 75 g (grams) of the flaked reaction product of Example 6; 200 g of isopropyl alcohol; and 52.5 g of water to form a reaction mixture. The reaction mixture was heated to 55° C. After 10 minutes there was add 388.5 g of epichlorohydrin. The reaction mixture was reheated to 55° C. and then 30 g of a 20% solution of sodium hydroxide in water was added while maintaining a temperature of 55° C. The 55° C. temperature was held for another 30 minutes. Then there was added 90 g of 20% solution of sodium hydroxide in water. The reaction mixture was held at 55° C. for another hour, heated to 65° C. and held for 30 minutes and then transferred to a separatory funnel. The upper clear brown organic layer (145.6 g) was stirred with 150 g water and 50 g of dry ice. The aqueous layer was discarded and the organic layer washed a second time and then vacuum distilled to recover excess epichlorohydrin and 105 g of dark resin of the epoxidized product of Example 6. This epoxy resin has a weight per epoxy equivalent of 203.1 and 225.8. This compares with a weight per epoxy equivalent of 210 for EPON 1031. Viscosities and weight per epoxy equivalent (WPE) of the epoxy resin of this Example 8 as well as comparisons with other epoxy resins prepared from polyphenols are shown below in tables wherein this example may be referred to as EX8.

EXAMPLE 9 (COMPARATIVE)

PREPARATION OF PHENOL-GLYOXAL POLYPHENOL USING ACIDIC (SULFONIC ACID) ION EXCHANGE RESIN

To 709.3 g of phenol (7.54 moles) and 35.5 g of Amberlyst 15 which is a dry sulfonic acid ion exchange resin sold by Rohm & Haas Co. at a temperature of 90° C. over 30 minutes, there was added 93 g of 40% glyoxal in water (0.64 moles). This resin was chosen since the resin used as catalyst in U.S. Pat. Nos.: 5,012,016; 5,146,006; and 5,191, 128, all to S. Li, were unavailable and this resin appeared to be the closest to such resin. The temperature was maintained at 90° C. for another 1.5 hours. After such time 88% of the aldehyde equivalents charged to the reaction mixture had reacted. Then there was vacuum distilled 42 g of distillate. On completion of the distillation 95% of the aldehyde equivalents charged to the reaction mixture had reacted. Another 93 g of 40% glyoxal in water was added over 31 minutes while the temperature was maintained at 90° C. for 1.5 hours. After such 1.5 hours, 81% of the aldehyde equivalents charged to the reaction mixture had reacted. Then there was vacuum distilled 70 g of distillate at 90° C. over a period of 30 minutes. The temperature of 90° C. was maintained for another 30 minutes after which time, 91% of the aldehyde equivalents charged to the reaction mixture had reacted. The molar ratio of glyoxal to phenol for the total of both glyoxal additions was 0.17. Catalyst was allowed to settle and relatively clear liquor (687 g) decanted off and neutralized to pH of 6 with 2.6 g of 50% sodium hydroxide. 650 g of neutralized solution was charged to a flask for atmospheric distillation to 160° C. The reaction mixture was then vacuum distilled to 175° C. to remove phenol. During the reaction, the aldehyde equivalents in the reaction mixture were maintained at less than about 70% of the aldehyde equivalents in the total quantity of glyoxal to be charged for making the polyphenol. Yield of product was 263 g. The resulting polyphenol was then comminuted, e.g., flaked. Properties of the polyphenol are given in tables which follow wherein this example may be referred to as EX9.

EXAMPLE 10

PREPARATION OF PHENOL-GLYOXAL CONDENSATION PRODUCT WITH TWO ADDITIONS OF GLYOXAL, OXALIC ACID CATALYST AND TOTAL GLYOXAL/PHENOL MOLE RATIO OF 0.22 FOR FIRST PORTION AND ADDITION OF PHENOL TO REDUCE THE GLYOXAL/PHENOL MOLE RATIO TO 0.17 FOR SECOND PORTION.

To 1419 g (15 moles) phenol and 56.5 g oxalic acid dihydrate at 90° C. there was added over 30 minutes 240 g of 40% glyoxal in water (1.655 moles). The temperature was maintained at 90° C. for another 1.5 hours and then there was vacuum distilled 148.3 g of distillate from the reaction mixture at 90° C. over a period of fifty minutes whereupon about 62% of the aldehyde equivalents charged to the reaction mixture had reacted after such fifty minute period. Another 240 g of 40% glyoxal in water (1.655 moles) was added to the reaction mixture over a 22 minute period while the temperature was maintained at 90° C. for 1.5 hours. About 58% of the aldehyde equivalents charged to the reaction mixture had reacted after this 1.5 hour period. There was then vacuum distilled 212.2 g of distillate at 90° C. over a period of 45 minutes. After such 45 minute period about 65% of the aldehyde equivalents charged to the reaction mixture had reacted. The molar ratio of glyoxal to phenol for the total of all the glyoxal additions was 0.22. The temperature of 90° C. was maintained for another 5 hours. After such 5 hour period about 87% of the aldehyde equivalents charged to the reaction mixture had reacted. Then the reaction mixture was divided into two. To one half (794 g) was added 214 g of phenol to adjust glyoxal/phenol mole ratio to 0.17. The reaction mixture with added phenol was heated at 90° C. for 2.5 hours whereupon 89% of the aldehyde equivalents charged to the reaction mixture had reacted. Percent water in the reaction mixture was 4.9%. The reaction mixture was then heated to 160° C. over 25 minutes and held at 160° C. for one hour, after which the bulk of phenol was removed by vacuum distillation to 175° C. The product was then discharged from the flask. The remaining one-half of reaction mixture without added phenol was heated to 160° C. as above and phenol removed by vacuum distillation to 175° C. The phenol-glyoxal condensation product made with the 0.22 mole ratio of glyoxal to phenol is referred to in the tables as EX10.22 whereas that made with the 0.17 mole ratio of glyoxal to phenol is referred to in the tables as EX10.17 During the reaction, for both EX10.17 and EX10.22, the aldehyde equivalents in the reaction mixture were maintained at less than about 70% of the aldehyde equivalents in the total quantity of glyoxal to be charged for making the phenol-glyoxal condensation product. Properties of the polyphenols are given in tables which follow. The polyphenol of EX10.17 and that of EX10.12 were further heated at 190° C. for one hour under full vacuum. Properties of these products are shown in the following tables wherein the heated sample of EX10.17 is referred to as EX10.17H and that of EX10.22 is referred to as EX10.22H. It can be seen from the tables that the heated samples show improved optical properties.

EXAMPLE 11

PREPARATION OF PHENOL-GLYOXAL CONDENSATION PRODUCT WITH TWO ADDITIONS OF GLYOXAL, GLYOXAL-PHENOL MOLE RATIO OF 0.17 WITH TRICHLOROACETIC ACID CATALYST AND USE OF BASIC MATERIAL IN REMOVAL OF HCL.

To 709.3 g (7.54 moles) phenol and 17.7 g trichloroacetic acid (2.5% based on the weight of phenol charged) at 90° C. there was added over 27 minutes 92.9 g of 40% glyoxal (0.64 moles) in water. The temperature was maintained for 1.5 hours and about 58% of aldehyde equivalents had reacted after such 1.5 hours. Subsequently, there was vacuum distilled 62.2 g of distillate from the reaction mixture at 90° C. over 26 minutes. After distillation, the aldehyde equivalents reacted (converted) was 70% of that charged and residual water content of the reaction mixture was about 3.5% Another 92.9 g of 40% glyoxal (0.64 moles for a total of 1.28 moles) was added over half an hour while the temperature was maintained for 1.5 hours. The total mole ratio of glyoxal to phenol in this example was 0.17. After such heating about 62% of aldehyde equivalents charged to the reaction mixture had reacted. Subsequently there was vacuum distilled 81.6 g of distillate at 90° C. over 25 minutes. After the distillation, the aldehyde equivalents converted was 72% of that charged and the residual water in the reaction mixture was 3.5%. The temperature was maintained at 90° C. for another 1.5 hours and about 88% of the aldehyde equivalents charged had reacted after such 1.5 hour period. One half hour later 1.0 g of pyridine was added. At such time 88 percent of aldehyde equivalents which had been charged to the reaction mixture had reacted. The temperature was raised to 125° C. over one half hour and held at this temperature for 70 minutes and further raised to 160° C. for 1.5 hours and held at this temperature for 23 minutes to complete decomposition of acid. The phenol-glyoxal condensation product was further heated at 190° C. for one hour under full vacuum to remove unreacted phenol and prepare the phenol-glyoxal condensation product which is also referred to as EX11 in the following tables.

During the reaction, the aldehyde equivalents in the reaction mixture were maintained at less than about 70% of the aldehyde equivalents in the total quantity of glyoxal to be charged for making the phenol-glyoxal condensation product.

EXAMPLE 12 (COMPARATIVE)

PREPARATION OF PHENOL-GLYOXAL CONDENSATION PRODUCT WITH TWO ADDITIONS OF GLYOXAL, GLYOXAL-PHENOL MOLE RATIO OF 0.17 WITH TRICHLOROACETIC ACID CATALYST WITHOUT USE OF BASIC MATERIAL IN REMOVAL OF HCL.

The procedure of Example 11 was followed except that: a basic material, e.g., pyridine, was not added to the reaction mixture prior to raising the temperature to 125° C. and removal of the catalyst; and the final temperature after removal of phenol was 175° C. Processing of this example was discontinued upon heating to 175° C. because the viscosity was unduly high. This example is also referred to in the tables as EX12.

TABLE 1

CHARACTERIZATION OF SOME PHENOL-GLYOXAL POLYPHENOLS

| EX | Mol Wgt Mw/Mn | Phenol, % | TPE, % | Viscosity cps(175° C.) |
|---|---|---|---|---|
| 1 | 451/331 | 0.15 | 4.15 | 480 |
| 2 | 464/347 (465/362)[a] | 0.29 | 5.10 | 510 |
| 3 | 468/351 | 2.05 | 8.53 | 300* |
| 4 | 572/387 | 3.46 | 13.21 | 900* |
| 5A | 538/376 | 1.13 | 10.1 | 891 |
| 6 | 494/353 | 0.04 | 1.73 | 530 |
| 7 | 508/358 | 0.04 | 2.74 | 670 |
| 9 | 475/356 | 0.19 | 10.42 | 2,400 |
| 10.17 | 485/348 | 3.80 | 5.5 | 350* |
| 10.17H | 496/357 | <0.05 | 5.79 | 1088 |
| 10.22 | 518/364 | 3.88 | 5.60 | 400* |
| 10.22H | 528/366 | <0.05 | 4.83 | 1700 |
| 11 | 518/363 | 0.3 | 4.85 | 2040 |
| 12 | 552/357 | 0.30 | 1.02 | >9,000 |

[a]value before catalyst was removed.
These examples have a high phenol content which depresses the viscosity.

It can be seen from the above Table 1 that Examples 1, 6 and 7 gave the lowest percentage of TPE even though Examples 1–3 used the same catalyst and the same mole ratio of reactants. The conventional catalysts such as HCl (EX4), sulfonic acid (EX5A and 9 give very high levels of TPE and even oxalic acid when not used with incremental additions of glyoxal and removal of distillates also gave a high value of TPE (EX3). The post heating at 190° C. in Examples 10.17H and 10.22H show no significant effect on molecular weight or free TPE but decreased in free phenol content and increased in viscosity.

TABLE 2

FLUORESCENCE DATA OBTAINED OF 0.05% SOLUTION OF THE POLYPHENOL OR EPOXIDIZED POLYPHENOL IN TETRAHYDROFURAN (THF) AT ACQUISITION TIME OF ONE SECOND AND AT AN EXCITATION WAVELENGTH OF 442 NM

| Example or Product | Maximum Intensity Counts | Wavelength Maximum, nm |
|---|---|---|
| 1 | 11232 | 526 |
| 5A | 6516 | 532 |
| 6 | 11502 | 538 |
| 7 | 10535 | 532 |
| EPON 1031* | 6403 | 528 |

*EPON 1031 (CAS No.: 7328-97-4) is a polyphenol containing tetraglycidyl ether of tetrakis (hydroxyphenyl)ethane and is sold by Shell Oil Co. of Emeryville, CA.

It can be seen from Table 2 above that Examples 1, 6 and 7 which are phenol-glyoxal condensation products of this invention had a fluorescence which was about 70% higher than Example 5A which was prepared with sulfonic acid catalyst. Similar results are shown in Tables 3 and 4 which follow.

TABLE 3

FLUORESCENCE OF 0.05% SOLUTION OF EPOXIDIZED POLYPHENOL IN THF AT EXCITATION WAVELENGTH OF 442 NM AND ACQUISITION TIME OF 1.0 SECOND

| Material | Maximum Intensity Counts | Wavelength Maximum, nm |
|---|---|---|
| EPON 1031 | 9640 | 527 |
| EX8 | 14,600 | 535 |

It can be seen from the above Table 3 that the product of Example 8, namely the epoxidized product of Example 6, shows about 50% more fluorescence than the commercial product EPON 1031.

TABLE 4

FLUORESCENCE DATA OBTAINED OF 0.05% SOLUTION OF THE POLYPHENOL IN TETRAHYDROFURAN (THF) AT ACQUISITION TIME OF ONE SECOND AND AT AN EXCITATION WAVELENGTH OF 442 NM WITH THE DATA OF THIS TABLE 4 BEING OBTAINED ON A DIFFERENT DATE FROM THAT OF TABLES 2 AND 3.

| Example | Concentration wt. % Of The Polyphenol | Maximum Intensity, Counts | Wavelength Maximum nm |
|---|---|---|---|
| 1 | 0.0500 | 16640 | 530 |
| 1 | 0.0500 | 16300 | 531 |
| 2 | 0.0503 | 13550 | 530 |
| 2 | 0.0503 | 13510 | 529 |
| 3 | 0.0500 | 12860 | 536 |
| 3 | 0.0500 | 12640 | 532 |
| 4 | 0.0500 | 13960 | 523 |
| 4 | 0.0490 | 13850 | 525 |
| 5A | 0.050 | 9920 | 535 |
| 5A | 0.050 | 9620 | 530 |
| 2* | 0.0498 | 6940 | 540 |
| 3* | 0.0501 | 5130 | 530 |
| 3* | 0.0501 | 5280 | 527 |
| 5A* | 0.0503 | 5010 | 530 |

*The values for these are of the reaction mixture before removal of catalyst.

It can be seen from Table 4 above, that Example 1 has a fluorescence which is substantially higher than the other examples, including Examples 2 and 3 which used the same catalyst in the same mole ratio of reactants.

TABLE 5

ULTRA VIOLET (UV) ABSORBANCE DATA IN DILUTE TETRAHYDROFURAN (10 MG/100 ML)

| Material | At 350 nm | At 365 nm |
|---|---|---|
| Example 1 | 0.544 | 0.300 |
| Example 2 | 0.470 | 0.258 |
| Example 3 | 0.500 | 0.270 |
| Example 5A | 0.367 | 0.220 |
| EP* of Example 5A | 0.290 | 0.168 |
| Example 6 | 0.515 | 0.288 |
| Example 8 | 0.400 | 0.223 |
| Example 9 | 0.266 | 0.134 |
| EX10.17 | 0.385 | 0.216 |
| EX10.17H | 0.416 | 0.224 |
| EX10.22 | 0.418 | 0.239 |
| EX10.22H | 0.470 | 0.258 |
| EX11 | 0.728, 0.739 | 0.395, 0.404 |
| EX12 | 0.465 | 0.317 |
| EPON 1031 | 0.273 | 0.161 |
| Pure TPE | 0.000 | 0.000 |

*Epoxy

It can be seen from the above Table 5 that Example 1 and Example 11 afford the highest absorbance at both 350 and 365 nm. All of the oxalic acid catalyzed products gave higher absorbance as compared to the sulfonic acid catalyzed products of Examples 5A and 9. All other things being equal, the greater concentrations of TPE provide lower optical properties. Also, it should be noted that TPE shows no absorbance under the test conditions. It can also be seen that the phenol-glyoxal condensation products of Example 10 and Example 11 which were heated at 190° C. for one hour, namely EX10.17H, EX10.22H, EX11.17H and EX11 had better optical properties as compared to the product before such heating, namely EX10.17, EX10.22, and EX11. Additionally, it can be seen that the epoxidized product of Example 1, namely Example 8, gave significantly higher absorbance than the commercial product EPON 1031. Although the product of Example 12 showed high absorbance values, its viscosity was unduly high, namely, over 9000 cps at 175° C. as shown in Table 1 above, and thus unacceptable.

TABLE 6

VISCOSITIES AND WEIGHT PER EPOXY EQUIVALENTS (WPE)

| Material | Mw/Mn | Viscosity, cps | WPE |
|---|---|---|---|
| EPON1031 | 895/395 | 14880 (100° C.) | 216 |
| | | 997 (125° C.) | |
| | | 172 (150° C.) | |
| EPOXY of Example 6 | 576/348 | 12210 (100° C.) | 214 |
| | | 1580 (125° C.) | |
| | | 440 (150° C.) | |
| Epoxy of Example 5A | 767/374 | 11580 (100° C.) | 233 |
| | | 821 (125° C.) | |
| | | 142 (150° C.) | |

TABLE 7

FLUORESCENCE OBTAINED OF PRODUCTS IN 0.05% SOLUTION IN THF AT EXCITATION WAVELENGTHS OF 442 NM BUT AT ACQUISITION TIME OF ONE-HALF OF A SECOND.

| | Counts at Maximum Wavelength | |
|---|---|---|
| Product of | Intensity | Maximum nm |
| EX6 | 19,960 | 531 |
| EX11 | 17,390 | 532 |
| EX10.22 | 19,040 | 530 |
| EX10.22H | 19,940 | 530 |
| EX10.17H | 20,120 | 530 |

TABLE 8

SOLUBILITY OF CONDENSATION PRODUCTS

Solubility at 50% acetone was attempted with the various phenol-glyoxal condensates. A large vial 718 inches in internal diameter was charged with 10 g each of acetone and solid, warmed with vigorous agitation and then allowed to settle for 10 days at room temperature. The total height of the mixes was 1.75 inches. The clear supernatant layer was measured and is reported below in millimeters (mm). Lower values are indicative of lower solubility.

| Material | Clear Liquor, mm |
|---|---|
| EX1 | 32 |
| EX2 | 28 |
| EX4 | 8 |
| EX5A | 23 |
| EX10.17 | 17 |
| EX10.22 | 22 |

TABLE 8-continued

SOLUBILITY OF CONDENSATION PRODUCTS
Solubility at 50% acetone was attempted with the various phenol-glyoxal condensates. A large vial 718 inches in internal diameter was charged with 10 g each of acetone and solid, warmed with vigorous agitation and then allowed to settle for 10 days at room temperature. The total height of the mixes was 1.75 inches. The clear supernatant layer was measured and is reported below in millimeters (mm). Lower values are indicative of lower solubility.

| Material | Clear Liquor, mm |
|---|---|
| EX6 | 41 |
| EX9 | 7 |
| EX11 | 24 |

Several materials were checked for 50% solubility in methyl ethyl ketone. The product of Examples 1–3 and 11 remained completely soluble at room temperature after standing 10 days. Product from Example 5A deposited some product after standing 3 days.

TABLE 9

METAL ION CONTENTS OF POLYPHENOLS & EPON 1031

| Metal Ion | EX1 | EX6 | EX7 | EX5A* | EPON 1031 |
|---|---|---|---|---|---|
| Na | 0.003 | 0.001 | 0.002 | 0.017 | 0.028 |
| Ca | 0.002 | 0.001 | 0.001 | <0.001 | 0.001 |
| Fe | <0.001 | <0.001 | 0.001 | <0.001 | <0.001 |
| K | 0.008 | <0.001 | <0.001 | <0.001 | 0.001 |

*This is product of EX5A on large scale equipment

EXAMPLE 13

PREPARATION OF PREPREGS AND LAMINATES

Prepregs and laminates were made from the following resinous matrix formulation.

| | Material | Percent by weight |
|---|---|---|
| 1. | Brominated epoxy resin (EPON 1124 A80 of Shell Chemical) | 60.0 |
| 2. | Phenol-glyoxal condensate (PGC) | 3.0 |
| 3. | Phenol novolac curing agent (Durite SD1711 of Borden Chemical) | 14.4 |
| 4. | Acetone | 15.05 |
| 5. | Methyl ethyl ketone | 7.45 |
| 6. | 2-methyl imidazole | 0.2 |

Two solutions of 2,000 cps viscosity (25° C.) were made wherein two different PGC's were used. The PGC's (phenol-glyoxal condensates) were the epoxides (glycidylated derivatives) of Example 6 and Example 5A as shown in the Examples hereinabove. The epoxy of Example (Ex) 6 was made by the process of Example 8 and the epoxy of Example 5A was made by substantially the same procedure. The two materials are characterized below in Test 13A.

Test 13A

| Epoxy of | Mw/Mn | Viscosity, cps | WPE |
|---|---|---|---|
| Ex. 6 | 576/348 | 12210(100° C.) | 214 |
| Ex. 5A | 767/374 | 11580(100° C.) | 233 |

Two-ply 11.5 inch square laminates of 7–8 mils thickness were made via a hand dip process using 2116 style glass (an E-glass) with a BGF 643 finish. Cure conditions were typical for meeting the National Electrical Manufacturers' Association (NEMA) FR4 specification, namely, 1.5 minutes at 325–350° C. in an oven for the prepreg. The prepreg was then cooled to room temperature and heated over 45 minutes to 350° F., and then held at this temperature for about 30 minutes before cooling to room temperature. The resin content for the laminates was about 60% by weight.

The laminates were then cut into 4 inch squares and inspected with modern automatic optical inspection (AOI) equipment. In the case of ultraviolet absorbance, the following equipment can be used: Hewlett-Packard's HP BV 3000, Teradyne's 5539 and Orbitech's VT 8000. The results of the AOI for fluorescence are shown in Test 13B below wherein the tests were carried out in duplicate or triplicate.

Test 13B

| Epoxy PGC in Formulation | Fluorescence Intensity | Dynamic Range Noise Level |
|---|---|---|
| EX.6 epoxy | 192.2 | 2.0 |
| | 194.7 | 2.0 |
| EX.5A epoxy | 130.8 | 1.6 |
| | 125.4 | 1.5 |
| | 135.5 | 1.8 |

The data in Test 13B above show that the formulation using the epoxy of Example 6 shows 48% higher fluorescence than the formulation using the epoxy of Example 5A.

Replacement of the epoxy of EX. 6 by unepoxidized material, i.e., the phenol-glyoxal condensation product of Example 6 in the laminating formulation in comparison with the phenol-glyoxal condensate of example 5A with the use of AOI as discussed above showed that the phenol-glyoxal condensate of Example 6 increased the fluorescence over that obtained with Example 5A by about 50% to 70% and provided clearer images to the CCD (charged couple device) cameras of the AOI equipment. The brominated epoxy for the above formulation can be partially or completely replaced by a bisphenol-A epoxy resin with comparable epoxy equivalent to obtain similar results.

The formulation of Example 13 is a preferred formulation. However, the brominated epoxy resin can vary from about 40% to 80% by weight of the formulation, and such resin can be substituted with a different halogen such as chlorine. Also, the epoxy resin need not be halogenated but if fire retardancy is desired, such retardancy can be obtained by the addition of a conventional fire retardant. The phenol-glyoxal condensate can vary in quantity from about 1% or 2% to about 15% and be substituted entirely or partially with an equal quantity of a phenol-glyoxal residue. The quantity of phenol novolac curing agent can vary from about 7% to about 35% and the quantity of solvent system can vary from about 10 to 35%, all percentages or parts being by weight.

EXAMPLE 14

FLUORESCENCE ANALYSIS IN COMPARISON WITH ACRIDINE ORANGE BASE

In this example, all spectra were collected using 0.05 wt. % solutions of the samples in spectroscopic grade tetrahydrofuran (THF). The solutions were prepared by dissolving the solids in the necessary amount of THF to give the desired concentration. The standard Acridine Orange Base (Aldrich Chemical Co. Milwaukee, Wis.) solution (0.78 $\mu$M) was prepared by diluting an aliquot of a concentrated solution of the dye in methanol. Concentration of the standard was confirmed by absorption spectroscopy. CM 1000 equipment was set to provide 442-nanometer excitation and measurements were taken using 0.5 second acquisition time. Table 14 presents the results of the measurements with fluorescence intensity reported in Counts per second as well as a percentage of the intensity of the standard at respective wavelength.

TABLE 14

RESULTS OF FLUORESCENCE ANALYSIS IN THE USING CM 1000
In this table, the excitation wavelength was 442 nm; acquisition time was 0.5 seconds and Concentration was 0.05 wt %.

| Sample | Fluorescence Maximum, nm | Intensity Counts/s | Intensity Relative to Acridine Orange Base Standard, % |
|---|---|---|---|
| Acridine Orange Base 0.78 $\mu$M (0.2 mg/L) In Methanol | 528 (maximum) 524 530 532 535 | 23800 24000 23800 23400 | |
| Condensate of Ex 5A | 532 | 24000 | 100 |
| Condensate of Ex 6 | 532 | 40600 | 170 |

What is claimed is:

1. In a laminate comprising superimposed porous substrates impregnated with a resinous matrix comprising an epoxy resin and a curing agent for the epoxy resin; the improvement which comprises said resinous matrix containing from about 1 to 35 parts by weight of a fluorescent polyphenol, said polyphenol being a member selected from the group consisting of a fluorescent phenol-glyoxal condensate, a fluorescent residue of a phenol-glyoxal condensate and mixtures thereof wherein the condensate is produced from a monohydric phenol and glyoxal by a method comprising
    (a) charging phenol to a reaction vessel and incrementally charging a total of about 0.15 to 0.22 moles of glyoxal for each mole of the phenol charged to the reaction vessel to form a reaction mixture at a temperature of about 80° C. to 100° C. in the presence of about 1% to 6%, based on the weight of phenol charged, of an acid catalyst which can be removed from the reaction mixture by heating and distilling the reaction mixture at a temperature below about 170° C., said catalyst selected from the group consisting of oxalic acid, trichloroacetic acid and trifluoroacetic acid;
    (b) incrementally removing water from the reaction mixture;
    (c) maintaining the aldehyde equivalents in the reaction mixture at less than about 70% of the aldehyde equivalents in the total quantity of glyoxal to be charged for making the condensation product;
    (d) distilling the reaction mixture at a temperature of less than about 170° C. to remove the acid catalyst when at least 85% of the aldehyde egivalents in the total quantity of glyoxal to be charged for making the condensation product have reacted, provided that prior to such distillation, a basic material is added to the reaction mixture in an amount sufficient to neutralize hydrochloric acid when the catalyst is trichloroacetic acid;
    (e) heating the reaction mixture at a temperature of about 175° C. to 200° C. for about 0.25 hours to 3 hours after step (d) above; and
    (f) removing unreacted phenol from the reaction mixture to obtain a phenol-glyoxal condensation product containing less than about 5% by weight of phenol.

2. The laminate of claim 1 wherein the curing agent is a phenol-formaldehyde novolac resin and the quantity of said fluorescent polyphenol is from about 1 to 15 parts.

3. The laminate of claim 2 wherein the fluorescent polyphenol is a phenol-glyoxal condensate.

4. A laminate having improved fluorescence, said laminate comprising a reinforcing agent and a resinous matrix wherein the matrix contains:
    (a) an epoxy resin;
    (b) a curing agent for the epoxy resin; and
    (c) about 1 to 35 parts of a member selected from the group consisting of,
        (i) a phenol-glyoxal condensate;
        (ii) a glycidylated phenol-glyoxal condensate;
        (iii) a reaction product of about 4 to 8 parts of a glycidyl epoxy resin for each part of a phenol-glyoxal condensate; and
        (iv) mixtures thereof, all of said parts being by weight wherein the epoxy resin, curing agent, the items (i) (ii), (iii) and/or (iv) comprise at least 75% of the resinous matrix and wherein the condensate has a fluorescence which is at least 25% higher than Acridine Orange Base at an excitation wavelength of 442 nm and an acquisition time of 0.5 seconds when the Acridine Orange Base is used at a concentration of 0.2 mg/liter in methanol and the phenol-glyoxal condensate is used at a concentration of 0.05 weight percent in tetrahydrofuran and not more than 6% of a tetraphenol ethane.

5. The cured laminate of claim 4.

6. The laminate of claim 4 wherein the phenol used to make the condensate is phenol itself and the quantity of free phenol in the condensate is from 0 to 5%.

7. The laminate of claim 4 wherein the cured laminate contains from about 40 to 80 parts by weight of an epoxy resin and the phenol is a monohydric mononuclear phenol having from 6 to 12 carbon atoms.

8. A porous substrate impregnated with about
    A. 40 to 80 parts by weight of an epoxy resin;
    B. about 7 to 35 parts by weight of a phenol-formaldehyde novolac;
    C. about 1 to 15 parts by weight of a highly fluorescent material selected from the group consisting of:
        (a). a phenol-glyoxal condensate;
        (b). the residue of a phenol-glyoxal condensate; and
        (c) mixtures of said condensate and residue;
    D. about 10 to 35 parts by by weight of a solvent system for the epoxy resin and the novolac; and
    E. an accelerator for curing the resin mixture wherein the condensate: (1) has a fluorescence which is at least 25% higher than Acridine Orange Base at an excitation wavelength of 442 nm and an acquisition time of 0.5 seconds when the Acridine Orange Base is used at a concentration of 0.2 mg/liter in methanol and the phenol-glyoxal condensate is used at a concentration of 0.05 weight percent in tetrahydrofuran; (2) is of a monohydric mononuclear phenol having from 6 to 12 carbon atoms, (3) and contains not more than 6% of a tetraphenol ethane.

9. A process for preparing resin impregnated substrates for use in preparing electrical laminates which process comprises impregnating said substrates with an impregnating composition comprising:
   A. An epoxy resin having a weight per epoxide value of from about 190 to 2,000;
   B. a curing agent for the epoxy resin;
   C. a solvent system for components A and B; then
   D. heating the resulting impregnated substrate to B stage resin and removing the solvent system;
the improvement which comprises including in the impregnating composition from about 1 to 15 parts by weight of the impregnating composition a member selected from the group consisting of,
   (a) fluorescent polyphenol of a phenol and glyoxal;
   (b) a fluorescent residue of a polyphenol of a phenol and glyoxal; and
   (c) mixtures of (a) and (b) wherein the polyphenol has a fluorescence which is at least 25% higher than Acridine Orange Base at an excitation wavelength of 442 nm and an acquisition time of 0.5 seconds when the Acridine Orange Base is used at a concentration of 0.2 mg/liter in methanol and the phenol-glyoxal condensate is used at a concentration of 0.05 weight percent in tetrahydrofuran and said condensate contains not more than 6% of tetraphenol ethane.

10. The process of claim 9 wherein the epoxy resin has a weight per epoxide value of from about 190 to about 500, the polyphenol contains not more than 4.15% of a tetraphenol ethane and and the phenol of the polyphenol is phenol itself.

11. A cured laminate prepared by pressing together and heating multiple plies of the impregnated substrates of claim 9.

12. A laminate comprising superimposed porous substrates impregnated with a resinous matrix wherein said resinous matrix comprises:
   A. About 40 to 80 parts by weight of an epoxy resin having a weight per epoxide value of about 190 to about 10,000
   B. About 7 to 35 parts by weight of a curing agent for the epoxy resin; the improvement which comprises including in the resinous matrix from about 1 to 15 parts of a fluorescent polyphenol said polyphenol being a member selected from the group consisting of a phenol-glyoxal condensate, the residue of a phenol-glyoxal condensate wherein such residue is that of a glycidylated phenol-glyoxal condensate or the reaction product of a polyepoxide and said phenol-glyoxal condensate and mixtures of said condensate and residue, said condensate prepared by:
      (a) charging, to a reaction vessel, a monohydric, mononuclear phenol having up to 12 carbon atoms and from about 0.06 to 0.11 moles of a 40% solution of glyoxal in water, the quantity of glyoxal based on the moles of phenol charged, to form a reaction mixture and wherein the reaction mixture is at a temperature of about 80° C. to 100° C. in the presence of about 3 to 5% of oxalic acid;
      (b) conducting a first distillation of the reaction mixture at said reaction temperature after about 1 to 5 hours from initial reaction of the phenol with the glyoxal in the reaction mixture and removing about 8% to 12% by weight of distillate, based on the quantity of phenol charged, from the reaction mixture;
      (c) charging to the reaction mixture another 0.06 to 0.11 moles of the glyoxal based on the moles of phenol charged wherein the total quantity of glyoxal charged to the reaction mixture is from about 0.15 to 0.22 moles of glyoxal for each mole of the phenol charged and continuing the reaction at the said reaction temperature for about another 1.5 to 6 hours after the commencement of the first distillation and then conducting a second distillation of the reaction mixture at the said reaction temperature to remove from about another 4% to 12% by weight of distillate based on the quantity of phenol charged;
      (d) continuing the reaction after the second distillation at the reaction temperature until at least 85% of the aldehyde equivalents of the total quantity of glyoxal to be charged for making the condensation product have reacted;
      (e) raising the temperature above about 130° C. to about 170° C. and distilling the reaction mixture to eliminate the catalyst;
      (f) heating the reaction mixture at a temperature of about 175° C. to 200° C. for about 0.25 hours to 3 hours after removal of the catalyst; and
      (g) removing unreacted phenol to recover a phenol-glyoxal condensation product containing not more than about 5% of unreacted phenol.

13. The laminate of claim 12 wherein the epoxy resin has a weight per epoxide value of about 190 to about 500.

14. The laminate of claim 12 wherein the curing agent is a phenol-formaldehyde novolac resin, the resinous matrix contains a curing accelerator and the mononuclear phenol for preparing the condensate is phenol itself.

15. In a laminate comprising superimposed porous substrates impregnated with an uncured resinous matrix comprising an epoxy resin and a curing agent for the epoxy resin; the improvement which comprises said resinous matrix containing from about 1 to 15 parts by weight, based on the weight of the epoxy and curing agent of a polyphenol, said polyphenol being a fluorescent phenol-glyoxal condensate having an ultraviolet absorbance of at least 0.260 at 365 nm and/or 0.400 at 350 nm and a fluorescence which is at least 25% higher than Acridine Orange Base, at an excitation wavelength of 442 nm and an acquisition time of 0.5 seconds when the Acridine Orange Base is used at a concentration of 0.2 mg/liter in methanol and the phenol-glyoxal condensate is used at a concentration of 0.05 weight percent in tetrahydrofuran.

16. The cured laminate of claim 15 wherein the resinous matrix includes a fire retardant.

17. The cured laminate of claim 15 wherein the resinous matrix includes a sufficient quantity of a halogenated epoxy resin to render the laminate fire retardant.

18. The laminate of claim 17 wherein the halogenated epoxy resin is a brominated epoxy resin.

19. A laminate of reinforcing fibers in a resinous matrix containing from 1 to 35 parts by weight of a member selected from the group consisting of a glycidylated phenol-glyoxal condensate, a phenol-glyoxal condensate and mixtures thereof wherein said phenol-glyoxal condensate prior to glycidylation contains not more than 4.15% of a tetraphenol ethane.

20. The cured laminate of claim 19 wherein prior to curing the condensate contains from 0 to 5% of a free phenol.

21. The laminate of claim 19 wherein the phenol is phenol itself.

22. A laminate of reinforcing fibers in a resinous matrix comprising an epoxy resin and a curing agent for the epoxy resin wherein the matrix contains from 1 to 35 parts by weight of a fluorescent member selected from the group consisting of (a) a polyphenol of a phenol and glyoxal, a residue of a polyphenol of a phenol and glyoxal and mixtures thereof wherein the polyphenol contains not more than 4.15% of a tetraphenol ethane.

23. The laminate of claim 22 wherein the member is a polyphenol of a phenol and glyoxal.

24. The laminate of claim 23 wherein the phenol is phenol itself.

25. The cured laminate of claim 24 wherein the polyphenol, prior to curing, has a viscosity of 300 to 2,500 cps at 175° C. and a free phenol content of 0 to 5%.

* * * * *